United States Patent
Kusuda et al.

(10) Patent No.: US 7,381,928 B2
(45) Date of Patent: Jun. 3, 2008

(54) THERMAL PROCESSING APPARATUS AND THERMAL PROCESSING METHOD

(75) Inventors: Tatsufumi Kusuda, Kyoto (JP); Yasuhiro Imaoka, Kyoto (JP); Hiromi Murayama, Kyoto (JP); Norio Yamamoto, Kyoto (JP); Naoto Mori, Kyoto (JP); Yoko Yoshihara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 110 days.

(21) Appl. No.: 11/194,337

(22) Filed: Aug. 1, 2005

(65) Prior Publication Data
US 2005/0258162 A1 Nov. 24, 2005

Related U.S. Application Data

(63) Continuation of application No. 10/347,610, filed on Jan. 20, 2003, now Pat. No. 6,998,580.

(30) Foreign Application Priority Data

Mar. 28, 2002 (JP) ............................. 2002-090569
Jul. 19, 2002 (JP) ............................. 2002-211135

(51) Int. Cl.
*F27D 11/00* (2006.01)
*A21B 2/00* (2006.01)

(52) U.S. Cl. ...................... 219/411; 219/390; 219/405; 392/416; 392/418; 118/724; 118/725; 118/50.1

(58) Field of Classification Search ................ 219/390, 219/388, 121.6, 405, 411; 392/416, 418, 392/423–4; 118/724–5, 50.1, 729
See application file for complete search history.

(56) References Cited

U.S. PATENT DOCUMENTS 4,567,352 A * 1/1986 Mimura et al. ............. 219/405
4,649,261 A    3/1987 Sheets (Continued)

FOREIGN PATENT DOCUMENTS

JP         57 162340        10/1982

(Continued)

OTHER PUBLICATIONS

U.S. patent No. 4,859,832 enclosed herewith corresponds to untranslated Japanese patent application laid-open No. 63-066930.

(Continued)

*Primary Examiner*—Shawntina Fuqua
(74) *Attorney, Agent, or Firm*—Ostrolenk, Faber, Gerb & Soffen, LLP

(57) ABSTRACT

A light source including a plurality of flash lamps emits flashes thereby flash-heating a semiconductor wafer held by a thermal diffuser and a hot plate. The current distance of irradiation between the thermal diffuser and the hot plate holding the semiconductor wafer and the light source is so adjusted as to attain predetermined intensity of irradiation. The distance of irradiation between the thermal diffuser and the hot plate and the light source can be changed or corrected by vertically moving the thermal diffuser and the hot plate. The thermal processing apparatus which uses the flash lamps, is thus capable of readily controlling the intensity of irradiation.

7 Claims, 6 Drawing Sheets

U.S. PATENT DOCUMENTS

| | | | |
|---|---|---|---|
| 4,859,832 A | 8/1989 | Uehara et al. | |
| 5,444,217 A | 8/1995 | Moore et al. | |
| 6,518,547 B2 * | 2/2003 | Takahashi et al. | 219/390 |
| 6,594,446 B2 * | 7/2003 | Camm et al. | 392/416 |
| 6,610,968 B1 * | 8/2003 | Shajii et al. | 219/497 |

FOREIGN PATENT DOCUMENTS

| | | |
|---|---|---|
| JP | 60 258928 | 12/1985 |
| JP | 61 198735 | 9/1986 |
| JP | 62 26571 | 6/1987 |
| JP | 63-066930 | 3/1988 |
| JP | 2001 237195 | 8/2001 |
| JP | P3 281018 | 2/2002 |

OTHER PUBLICATIONS

Untranslated Korean Office Action issued May 30, 2005 against counterpart Korean application No. 10-2003-0066756 citing U.S. patent No. 5,444,217.

English translation of Abstract for Japanese Patent Application Laid-Open No. 2001-237195.

English translation of Abstract for Japanese Patent Application Laid-Open No. 3281018 (2002).

English translation of Abstract for Japanese Patent Application Laid-Open No. 61-198735 (1986).

English translation of Abstract for Japanese Patent Application Laid-Open No. 62-26571 (1987).

English translation of Abstract for Japanese Patent Application Laid-Open No. 57-162340 (1982).

* cited by examiner

THERMAL PROCESSING APPARATUS AND THERMAL PROCESSING METHOD

CROSS REFERENCE TO RELATED APPLICATION

This application is a continuation of U.S. application Ser. No. 10/347,610 filed Jan. 20, 2003 now U.S. Pat. No. 6,998,580 entitled THERMAL PROCESSING APPARATUS AND THERMAL PROCESSING METHOD, which claims the benefit of Japanese Appln. S.N. P2002-090569 filed Mar. 28, 2002 and Japanese Appln. S.N. P2002-211135 filed Jul. 19, 2002, the contents of which are incorporated by this reference.

BACKGROUND OF THE INVENTION

1. Field of the Invention

The present invention relates to a thermal processing apparatus and a thermal processing method of irradiating a semiconductor wafer or a glass substrate (hereinafter simply referred to as "substrate") with a flash thereby thermally processing the substrate.

2. Description of the Background Art

In general, a thermal processing apparatus such as a lamp annealing apparatus employing a halogen lamp is used in an ion activation step for a semiconductor wafer subsequent to an ion implantation step. This thermal processing apparatus heats (anneals) the semiconductor wafer to a temperature of about 1000° C. to 1100° C., for example, thereby executing ion activation of the semiconductor wafer. The thermal processing apparatus increases the temperature of the substrate at a speed of about several 100 degrees per second through the energy of light emitted from the halogen lamp.

However, it has been proved that the profile of the ions implanted into the semiconductor wafer is rounded, i.e., the ions are thermally diffused also when ion activation of the semiconductor wafer is executed through the thermal processing apparatus increasing the temperature of the substrate at the speed of about several 100 degrees per second. In this case, the ions are diffused even if the same are implanted into the surface of the semiconductor wafer in high concentration, and hence the ions must be implanted disadvantageously beyond necessity.

In order to solve the aforementioned problem, there has been proposed a technique of irradiating the surface of the semiconductor wafer with a flash emitted from a xenon flash lamp or the like thereby increasing the temperature of only the surface of the semiconductor wafer subjected to ion implantation in an extremely short time of not more than several milliseconds. When the surface of the semiconductor wafer is heated with the flash emitted from the xenon flash lamp in an extremely short time, there is no sufficient time for diffusing the ions and hence only ion activation can be executed without rounding the profile of the ions implanted into the semiconductor wafer.

When such a thermal processing apparatus is provided with a plurality of xenon flash lamps, however, a heat gradient corresponding to the light intensity gradient of the xenon flash lamps takes place on the substrate, to disadvantageously result in heterogeneous thermal processing of the substrate.

A general thermal processing apparatus using no flash lamps can solve this problem of the heat gradient by rotating the thermally processed substrate. In the thermal processing apparatus employing the flash lamps, however, the time for emitting flashes is so short that the problem of the heat gradient cannot be solved by rotating the substrate.

Also in the thermal processing apparatus employing xenon flash lamps, process conditions must be changed for obtaining optimum conditions in the process, similarly to the conventional lamp annealing apparatus. In the thermal processing apparatus employing photoirradiation, one of the most important process conditions is the intensity of irradiation. The general lamp annealing apparatus employing a halogen lamp can relatively readily adjust the intensity of irradiation by controlling power supplied to the lamp.

In the case of the thermal processing apparatus employing xenon flash lamps, however, a method of adjusting the intensity of irradiation by changing a main discharge voltage applied to the lamps results in various demerits. When the main discharge voltage applied to the xenon flash lamps is changed, the waveforms of the quantity of emission and the time are changed while spectral distribution varies with the change of the discharge voltage. In other words, not only the intensity of irradiation but also optical characteristics of the flashes vary when the main discharge voltage applied to the lamps is simply changed, to result in disintegration of correlation between the intensity of irradiation and the wafer temperature, leading to extreme difficulty of temperature control. When the main discharge voltage applied to the xenon flash lamps is changed, degradation characteristics of the lamps are also disadvantageously varied.

SUMMARY OF THE INVENTION

The present invention is directed to a thermal processing apparatus irradiating a substrate with a flash thereby heating the substrate.

According to the present invention, the thermal processing apparatus comprises a light source having a plurality of flash lamps, a holding element, holding the substrate, comprising an assist-heating mechanism preheating the substrate, and an adjusting element adjusting the distance of irradiation between the holding element holding the substrate and the light source when the light source emits flashes.

The thermal processing apparatus can control the intensity of irradiation by adjusting the distance of irradiation while keeping a discharge voltage applied to the flash lamps constant. Thus, the thermal processing apparatus using flash lamps can readily control the intensity of irradiation.

A thermal processing apparatus according to another aspect of the present invention comprises a plurality of flash heating elements each irradiating a substrate with a flash and a holding element holding the substrate, while the distance between the surface of the substrate and the plurality of flash heating elements is set to at least 40 mm and not more than 100 mm.

The distance between the surface of the substrate and the plurality of flash heating elements is set to at least 40 mm and not more than 100 mm, so that the thermal processing apparatus can homogeneously thermally process the substrate also when using the plurality of flash heating elements.

The present invention is also directed to a thermal processing method of irradiating a substrate with a flash thereby heating the substrate.

Accordingly, an object of the present invention is to provide a thermal processing apparatus capable of readily controlling the intensity of irradiation also when employing a flash lamp.

Another object of the present invention is to provide a thermal processing apparatus capable of homogeneously thermally processing a substrate also when using a plurality of flash heating elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings.

1. First Embodiment

Figure 1:
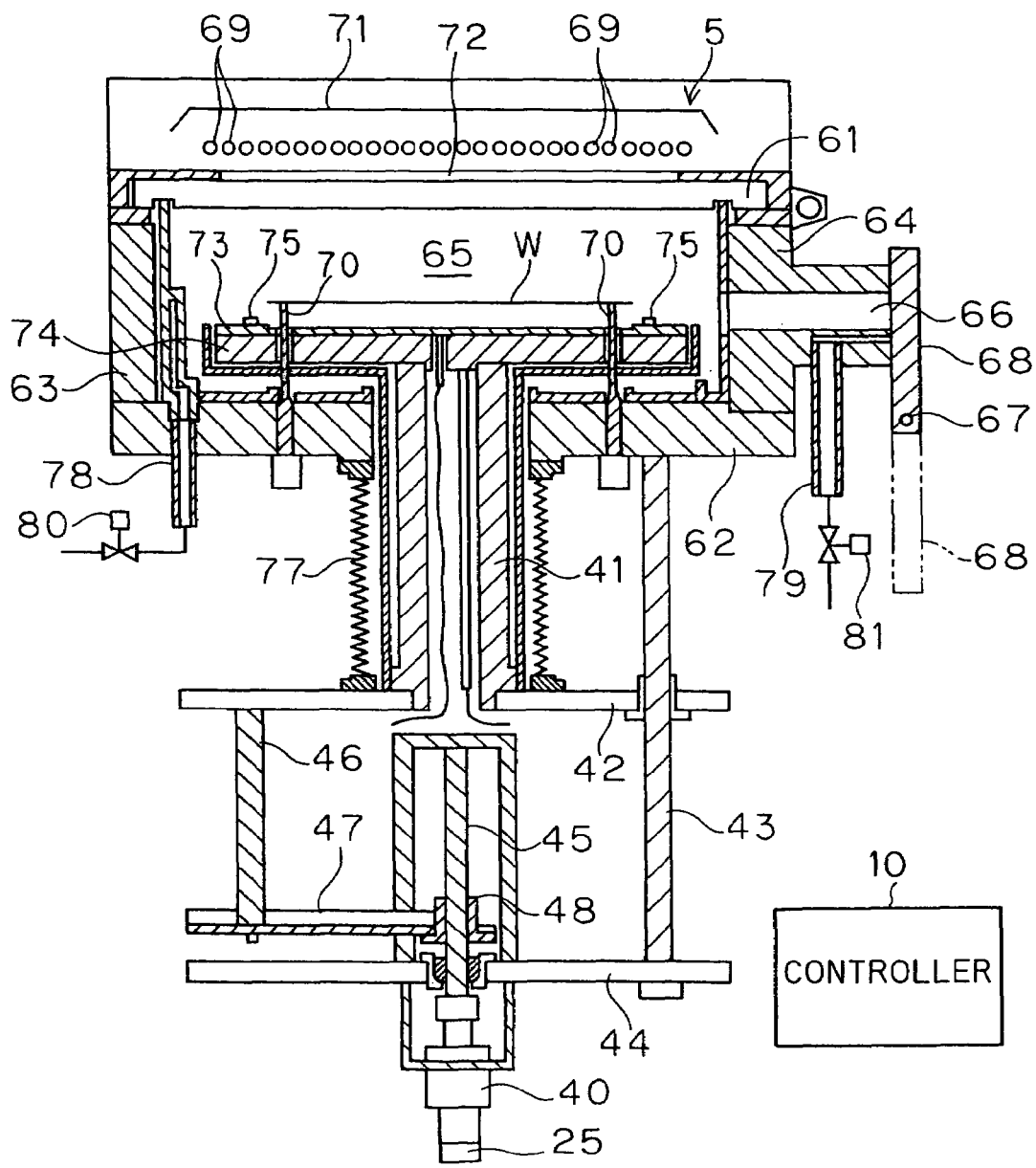
FIGS. 1 and 2 are cross-sectional views showing a thermal processing apparatus according to a first embodiment of the present invention.
Figure 2:
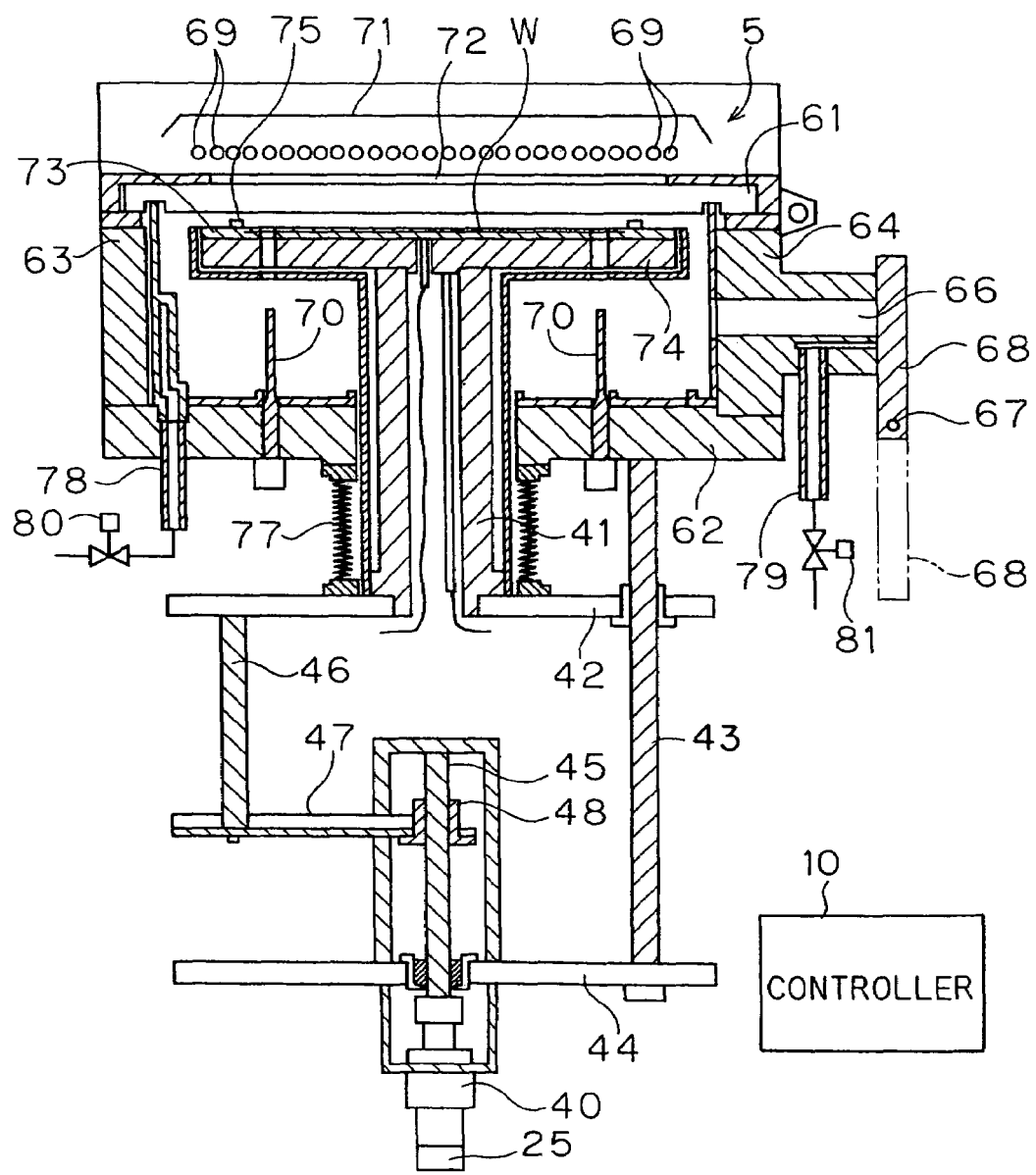

FIGS. 1 and 2 are cross-sectional views showing a thermal processing apparatus according to a first embodiment of the present invention. This thermal processing apparatus thermally processes substrates such as semiconductor wafers with flashes emitted from xenon flash lamps.

This thermal processing apparatus comprises a chamber 65 consisting of a translucent plate 61, a base plate 62 and a pair of side plates 63 and 64 for storing and thermally processing a semiconductor wafer W therein. The translucent plate 61 forming the upper portion of the chamber 65 is made of an infrared-transparent material such as quartz, for example, for serving as a chamber window transmitting light emitted from a light source 5 and guiding the same into the chamber 65. Support pins 70 are uprightly provided on the base plate 62 forming the chamber 65 for supporting the semiconductor wafer W from under the lower surface thereof through a thermal diffuser 73 and a hot plate 74 described later.

The side plate 64 forming the chamber 65 is provided with an opening 66 for introducing/discharging the semiconductor wafer W into/from the chamber 65. The opening 66 can be opened/closed with a gate valve 68 rotated about a shaft 67. A transport robot (not shown) introduces the semiconductor wafer W into the chamber 65 through the opening 66 in an opened state. When the semiconductor wafer W is thermally processed in the chamber 65, the gate valve 68 closes the opening 66.

The chamber 65 is provided under the light source 5. The light source 5 comprises a plurality of (27 in this embodiment) xenon flash lamps 69 (hereinafter also referred to simply as "flash lamps 69") and a reflector 71. The plurality of flash lamps 69 formed by elongated cylindrical bar lamps respectively are arranged in parallel with each other so that the longitudinal direction thereof is along the horizontal direction. The reflector 71 is arranged above the plurality of flash lamps 69 to cover the overall flash lamps 69.

Each xenon flash lamp 69 comprises a glass tube filled up with xenon gas and provided on both ends thereof with an anode and a cathode connected to a capacitor as well as a trigger electrode wound on an outer part of the glass tube. In an ordinary state, no electricity flows in the glass tube filled up with the xenon gas, which is an electrical insulator. When a high voltage is applied to the trigger electrode for insulation breakdown, electricity stored in the capacitor instantaneously flows in the glass tube for heating the xenon gas with Joule heat and emitting light. This xenon flash lamp 69 can emit extremely stronger light as compared with a continuously burning light source by converting previously stored electrostatic energy to an extremely short optical pulse of 0.1 to 10 milliseconds.

A light diffuser 72 is arranged between the light source 5 and the translucent plate 61. This light diffuser 72 is prepared by performing light diffusion working on the surface of a quartz glass member employed as an infrared-transparent material.

Part of the light emitted from the flash lamps 69 is directly transmitted through the light diffuser 72 and the translucent plate 61 and introduced into the chamber 65. The remaining part of the light emitted from the flash lamps 69 is reflected by the reflector 71 and thereafter transmitted through the light diffuser 72 and the translucent plate 61 to be introduced into the chamber 65.

The chamber 65 is provided therein with the hot plate 74 and the thermal diffuser 73. The thermal diffuser 73 is stuck on the upper surface of the hot plate 74. Pins 75 for preventing the semiconductor wafer W from displacement are provided on the surface of the thermal diffuser 73.

The hot plate 74 is employed for preheating (assist-heating) the semiconductor wafer W. This hot plate 74 is made of aluminum nitride, and provided therein with a heater and a sensor for controlling the heater. On the other hand, the thermal diffuser 73 is employed for diffusing thermal energy from the hot plate 74 and homogeneously preheating the semiconductor wafer W. A material such as sapphire ($Al_2O_3$: aluminum oxide) or quartz having relatively small thermal conductivity is employed for forming the thermal diffuser 73.

A motor 40 vertically moves the thermal diffuser 73 and the hot plate 74 between a position for introducing/discharging the semiconductor wafer W into/from the chamber 65 shown in FIG. 1 and a position for thermally processing the semiconductor wafer W shown in FIG. 2.

The hot plate 74 is coupled to a moving plate 42 through a cylindrical member 41. A guide member 43 suspended from the base plate 62 of the chamber 65 vertically movably guides the moving plate 42. A fixed plate 44 is fixed to the lower end of the guide member 43, while the motor 40 rotating/driving a ball screw 45 is arranged on the center of the fixed plate 44. The ball screw 45 is engaged with a nut 48 coupled with the moving plate 42 through coupling members 46 and 47. Thus, the thermal diffuser 73 and the hot plate 74 driven by the motor 40 are vertically movable between the position for introducing/discharging the semiconductor wafer W into/from the chamber 65 shown in FIG. 1 and the position for thermally processing the semiconductor wafer W shown in FIG. 2.

The thermal diffuser 73 and the hot plate 74 are moved down to the position for introducing/discharging the semiconductor wafer W into/from the chamber 65 shown in FIG. 1 so that the semiconductor wafer W introduced into the chamber 65 through the opening 66 by the transport robot (not shown) can be placed on the support pins 70 or the semiconductor wafer W placed on the support pins 70 can be discharged from the chamber 65 through the opening 66. In this state, the upper ends of the support pins 70 project upward beyond the surface of the thermal diffuser 73 via through holes formed in the thermal diffuser 73 and the hot plate 74.

On the other hand, the thermal diffuser 73 and the hot plate 74 are moved up to the position for thermally processing the semiconductor wafer W shown in FIG. 2 beyond the upper ends of the support pins 70 for thermally processing the semiconductor wafer W. In the process of the upward movement of the thermal diffuser 73 and the hot plate 74 from the position for introducing/discharging the semiconductor wafer W into/from the chamber 65 shown in FIG. 1 to the thermal processing position shown in FIG. 2, the semiconductor wafer W placed on the support pins 70 is received by the thermal diffuser 73, moved up while the lower surface thereof is supported on the surface of the thermal diffuser 73 and horizontally held on a position close to the translucent plate 61 provided in the chamber 65. In the process of the downward movement of the thermal diffuser 73 and the hot plate 74 from the thermal processing position to the position for introducing/discharging the semiconductor wafer W into/from the chamber 65, on the other hand, the semiconductor wafer W supported on the thermal diffuser 73 is transferred to the support pins 70.

When the thermal diffuser 73 and the hot plate 74 supporting the semiconductor wafer W are moved up to the thermal processing position, it follows that the translucent plate 61 is located between the semiconductor wafer W supported by the thermal diffuser 73 and the hot plate 74 and the light source 5. The current distance between the thermal diffuser 73 and the light source 5 can be adjusted to an arbitrary value by controlling the rotational frequency of the motor 40, as described later in detail.

An elastic bellows 77 is arranged between the base plate 62 of the chamber 65 and the moving plate 42 to enclose the cylindrical member 41 for maintaining the chamber 65 in an airtight state. The bellows 77 is contracted when the thermal diffuser 73 and the hot plate 74 are moved up to the thermal processing position, and expanded when the thermal diffuser 73 and the hot plate 74 are moved down to the position for introducing/discharging the semiconductor wafer W into/from the chamber 65 for cutting off the atmosphere in the chamber 65 from the external atmosphere.

The side plate 63 of the chamber 65 opposite to the opening 66 is formed with an introduction path 78 communicatively connected to an on-off valve 80. This introduction path 78 is employed for introducing gas such as inactive nitrogen gas, for example, necessary for processing into the chamber 65. On the other hand, the opening 66 of the side plate 64 is formed with a discharge path 79 communicatively connected to another on-off valve 81. This discharge path 79, employed for discharging gas from the chamber 65, is connected to exhaust means (not shown) through the on-off valve 81.

Figure 3:
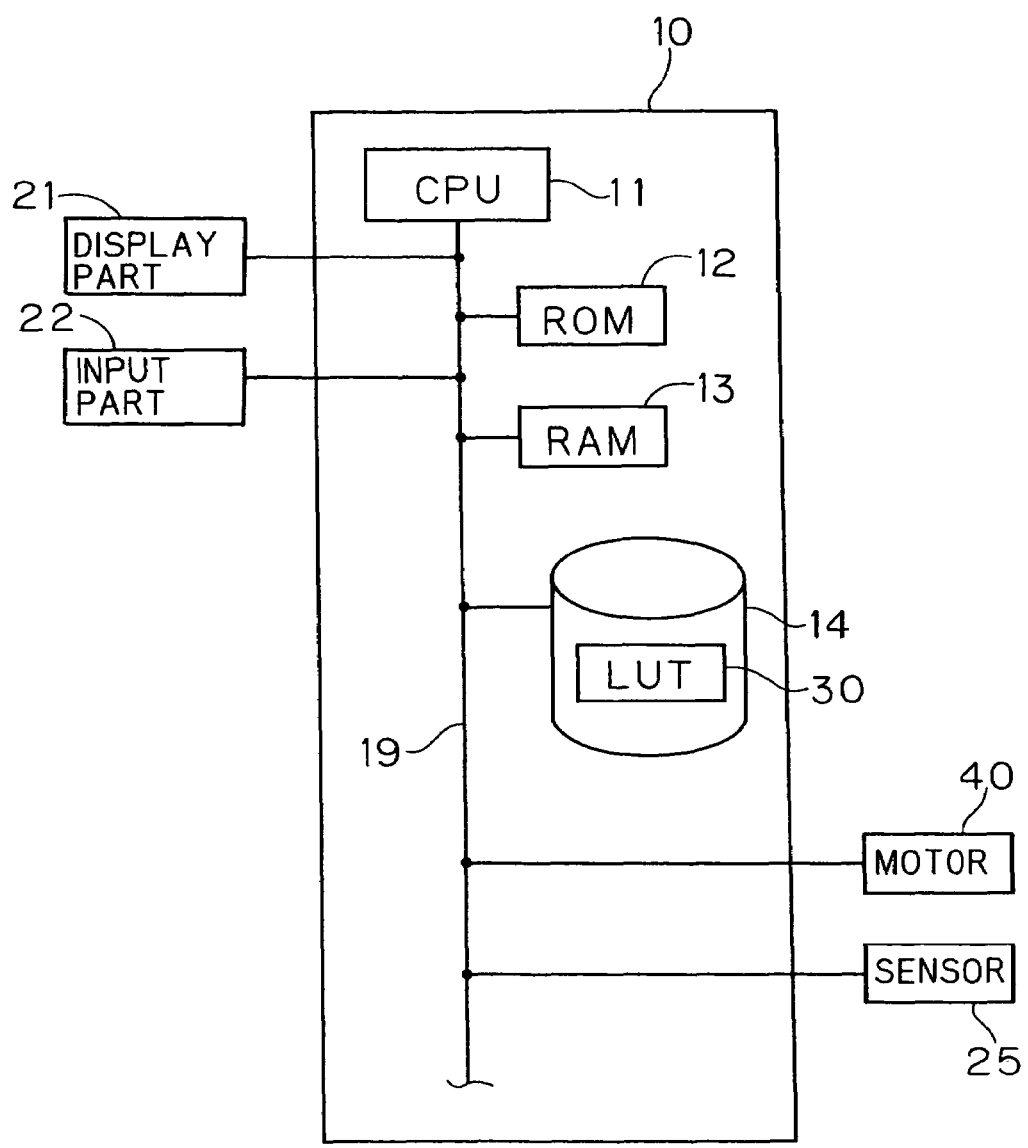
FIG. 3 is a block diagram showing the structure of a controller.

The aforementioned thermal processing apparatus further comprises a controller 10 for controlling the respective mechanical parts such as the motor 40. FIG. 3 is a block diagram showing the structure of the controller 10. The controller 10 has a hardware structure similar to that of a general computer. In other words, the controller 10 is formed by connecting a CPU 11 performing various arithmetic processing operations, a ROM (read-only memory) 12 storing a basic program, a RAM (random-access memory) 13 storing various information and a magnetic disk 14 storing control software, data etc. to a bus line 19.

The motor 40 and a sensor 25 of the thermal processing apparatus are also electrically connected to the bus line 19. The sensor 25, distance measuring means measuring the distance between the thermal diffuser 73 and the flash lamps 69, is formed by an encoder detecting the rotational frequency of the motor 40, for example, in the first embodiment. The CPU 11 of the controller 10 can control the motor 40 so that the distance between the thermal diffuser 73 and the light source 5 reaches a prescribed value on the basis of a result of detection of the sensor 25.

A display part 21 and an input part 22 are further electrically connected to the bus line 19. The display part 21, formed by a liquid crystal display or the like, for example, displays various information such as results of processing and recipe contents. The input part 22, formed by a keyboard, a mouse etc., for example, accepts entry of commands and parameters. An operator of the thermal processing apparatus can input commands and parameters from the input part 22 while confirming contents displayed on the display part 21. The display part 21 and the input part 22 may alternatively be integrated into a touch panel.

The operation of the thermal processing apparatus according to the first embodiment of the present invention for thermally processing the semiconductor wafer W is now described. This thermal processing apparatus processes the semiconductor wafer W already subjected to ion implantation.

In this thermal processing apparatus, the thermal diffuser 73 and the hot plate 74 are arranged on the position for introducing/discharging the semiconductor water W into/from the chamber 65 shown in FIG. 1 so that the transport robot (not shown) introduces the semiconductor wafer W into the chamber 65 through the opening 66 and places the same on the support pins 70. When the semiconductor wafer W is completely introduced into the chamber 65, the gate valve 68 closes the opening 66. Thereafter the motor 40 moves the thermal diffuser 73 and the hot plate 74 to the position for thermally processing the semiconductor wafer W shown in FIG. 2, for horizontally holding the semiconductor wafer W.

At this time, the CPU 11 of the controller 10 adjusts the distance between the thermal diffuser 73 and the hot plate 74 holding the semiconductor wafer W and the light source 5 to obtain predetermined intensity of irradiation. More specifically, the correlation between the distance of irradiation and the intensity of irradiation on the surface of the semiconductor wafer W irradiated with flashes emitted from the light source 5 has been obtained by an experiment or simulation. The term "distance of irradiation" indicates the distance between the thermal diffuser 73 and the hot plate 74 holding the semiconductor wafer W, irradiated with the flashes emitted from the light source 5, and the light source 5. The correlation between the distance of irradiation and the intensity of irradiation on the surface of the semiconductor wafer W held by the thermal diffuser 73 and the hot plate 74 is experimentally obtained and a correlation table is created.

Figure 4:
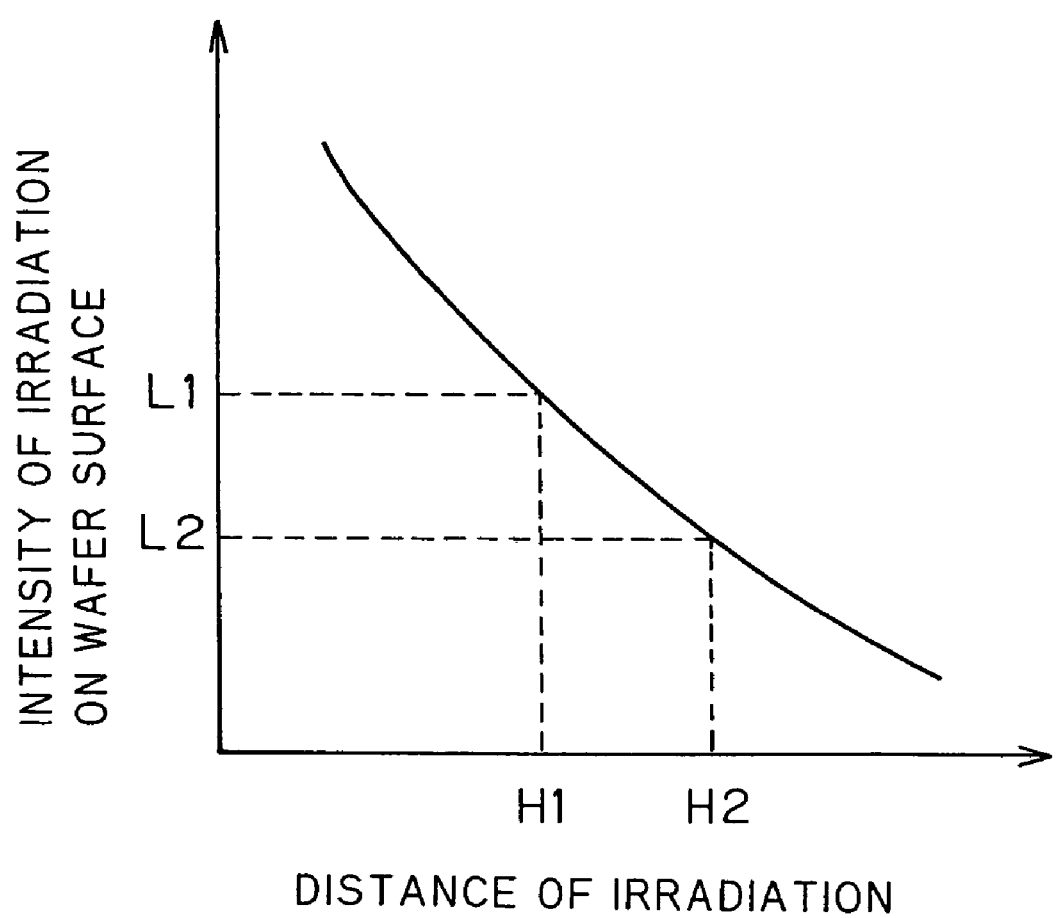
FIG. 4 illustrates an exemplary correlation table showing the correlation between the intensity of irradiation on the surface of a semiconductor wafer and the distance of irradiation.

FIG. 4 illustrates an exemplary correlation table showing the correlation between the intensity of irradiation on the surface of the semiconductor wafer W and the distance of irradiation. The intensity of irradiation on the surface of the semiconductor wafer W is reduced as the distance of irradiation is increased.

The CPU 11 stores the correlation table such as that shown in FIG. 4 in the magnetic disk 14 as a lookup table LUT (FIG. 3). The CPU 11 obtains the distance of irradiation corresponding to the predetermined intensity of irradiation with reference to the lookup table LUT, and controls the motor 40 so that the distance between the thermal diffuser 73 and the hot plate 74 holding the semiconductor wafer W and the light source 5 reaches this level. The predetermined intensity of irradiation may alternatively be described in a recipe as to the semiconductor wafer W to be processed, or the operator of the thermal processing apparatus may alternatively input the same through the input part 22 every processing. Assuming that the operator inputs intensity L1 of irradiation necessary for processing, the CPU 11 obtains a distance H1 of irradiation corresponding to the intensity L1 of irradiation from the lookup table LUT and controls the motor 40 so that the distance between the thermal diffuser 73 and the hot plate 74 holding the semiconductor wafer W and the light source 5 reaches the distance H1 of irradiation.

When the semiconductor wafer W is moved up to the thermal processing position in this manner, the controller 10 opens the on-off valves 80 and 81 for forming a flow of nitrogen gas in the chamber 65. The heater stored in the hot plate 74 previously heats the thermal diffuser 73 and the hot plate 74 to a prescribed temperature. After the thermal diffuser 73 and the hot plate 74 are moved up to the position for thermally processing the semiconductor wafer W, therefore, the heated thermal diffuser 73 comes into contact with the semiconductor wafer W to preheat the same and gradually increase the temperature thereof.

In this state, the thermal diffuser 73 continuously heats the semiconductor wafer W. When the temperature of the semiconductor wafer W is increased, a temperature sensor (not shown) regularly monitors whether or not the surface temperature of the semiconductor wafer W reaches a preheating temperature T1.

This preheating temperature T1 is about 200° C. to 600° C., for example. In this range of the preheating temperature T1, the ions implanted into the semiconductor wafer W are not diffused.

When the surface temperature of the semiconductor wafer W reaches the preheating temperature T1, the controller 10 lights the flash lamps 69 for performing flash heating. In this flash heating step, the flash lamps 69 are lit for about 0.1 msec. to about 10 msec. Thus, it follows that the flash lamps 69 converting previously stored electrostatic energy to such extremely short optical pulses emit extremely strong flashes.

According to this flash heating, the intensity of irradiation on the surface of the semiconductor wafer W instantaneously reaches the level L1, and the surface temperature thereof instantaneously reaches a temperature T2 of about 1000° C. to 1100° C. necessary for ion activation of the semiconductor wafer W. The thermal processing apparatus heats the surface of the semiconductor wafer W to this processing temperature T2, thereby activating the ions implanted into the semiconductor wafer W. Therefore, the intensity L1 of irradiation for obtaining the temperature T2 necessary for ion activation may be input from the input part 22 or set in the recipe.

In flash heating, the thermal processing apparatus increases the surface temperature of the semiconductor wafer W to the processing temperature T2 in an extremely short time of about 0.1 msec. to 10 msec., thereby completing activation of the ions in the semiconductor wafer W in a short time. Therefore, the ions implanted into the semiconductor wafer W are not diffused but the profile of the ions implanted into the semiconductor wafer W can be prevented from rounding. The time necessary for ion activation is extremely short as compared with that necessary for diffusion of the ions, and hence ion activation is completed in the short time of about 0.1 msec. to 10 msec. causing no diffusion.

Further, the thermal processing apparatus heats the surface of the semiconductor wafer W to the preheating temperature T1 of about 200° C. to 600° C. with the hot plate 74 before lighting the flash lamps 69 for heating the semiconductor wafer W, whereby the flash lamps 69 can quickly heat the semiconductor wafer W to the processing temperature T2 of about 1000° C. to 1100° C.

The hot plate 74 is moved up along with the semiconductor wafer W, for preheating the semiconductor wafer W with no hindrance regardless of adjustment of the distance of irradiation.

After terminating the flash heating step, the motor 40 moves down the thermal diffuser 73 and the hot plate 74 to the position for introducing/discharging the semiconductor wafer W into/from the chamber 65 shown in FIG. 1, while the opening 66 closed by the gate valve 68 is opened. The transport robot (not shown) discharges the semiconductor wafer W placed on the support pins 70 from the chamber 65. Thus, a series of thermal processing operations are completed.

In order to change the processing temperature, i.e., the intensity of irradiation in the thermal processing apparatus, the operator inputs new intensity of irradiation through the input part 22. In order to change the intensity of irradiation for the semiconductor wafer W from the level L1 to a level L2, for example, the operator newly inputs this intensity L2 of irradiation through the input part 22. Then, the CPU 11 obtains a distance H2 of irradiation corresponding to the new intensity L2 of irradiation from the lookup table LUT and controls the motor 40 to change the distance between the thermal diffuser 73 and the hot plate 74 holding the semiconductor wafer W and the light source 5 from the distance H1 of irradiation to the distance H2 of irradiation. Thus, the CPU 11 adjusts, i.e., changes the distance of irradiation between the thermal diffuser 73 and the hot plate 74 holding the semiconductor wafer W, irradiated from the flash emitted from the light source 5, and the light source 5.

The correlation between the intensity of irradiation on the surface of the semiconductor wafer W and the distance of irradiation itself may be changed due to deterioration of the flash lamps 69 or the like. In this case, the operator inputs a correction quantity for the distance of irradiation through the input part 22 after the CPU 11 adjusts the distance of irradiation according to the lookup table LUT. When the flash lamps 69 are deteriorated to reduce illuminance, for example, the operator inputs a correction quantity for reducing the distance of irradiation. Then, the CPU 11 controls the motor 40 so that the distance between the thermal diffuser 73 and the hot plate 74 holding the semiconductor wafer W and the light source 5 reaches a value obtained by adding the correction quantity to the distance of irradiation obtained from the lookup table LUT. Thus, the thermal processing apparatus adjusts, i.e., corrects the distance of irradiation for compensating for change of the apparatus state such as deterioration of the flash lamps 69.

As hereinabove described, the intensity of irradiation can be controlled by adjusting the distance of irradiation while keeping the main discharge voltage applied to the flash lamps 69 constant, whereby the intensity of irradiation can be readily controlled without varying optical characteristics of the light emitted from the flash lamps 69.

2. Second Embodiment

Figure 5:
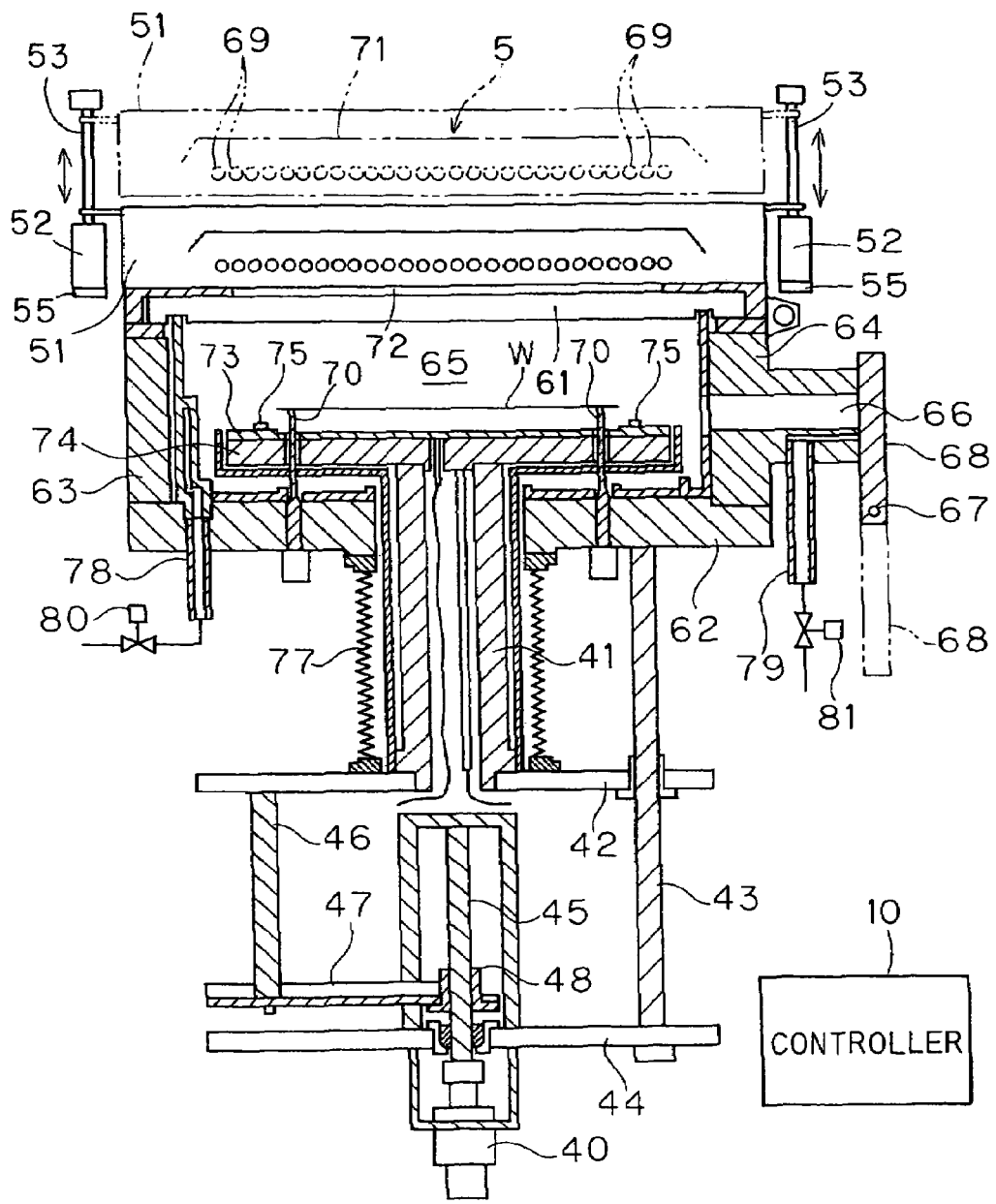
FIG. 5 is a cross-sectional view showing a thermal processing apparatus according to a second embodiment of the present invention.

A thermal processing apparatus according to a second embodiment of the present invention is now described. While the thermal processing apparatus according to the aforementioned first embodiment adjusts the distance of irradiation by adjusting the positions of the thermal diffuser 73 and the hot plate 74 holding the semiconductor wafer W, the thermal processing apparatus according to the second embodiment adjusts the distance of irradiation by adjusting the position of a light source 5. FIG. 5 is a cross-sectional view showing the thermal processing apparatus according to the second embodiment of the present invention. Members similar to those of the thermal processing apparatus according to the aforementioned first embodiment are denoted by the same reference numerals, to omit redundant description.

In the thermal processing apparatus according to the second embodiment, a ball screw 53 rotated by a pair of motors 52 vertically moves a casing 51 storing flash lamps 69 and a reflector 71. The distance between a thermal diffuser 73 and a hot plate 74 and the light source 5 can be arbitrarily adjusted by controlling the rotational frequency of the motors 52.

A sensor 55, distance measuring means measuring the distance between the thermal diffuser 73 and the flash lamps 69, is formed by an encoder detecting the rotational frequency of the motors 52 in the second embodiment. The motors 52 and the sensor 55 are electrically connected to a bus line 19 of a controller 10. Thus, a CPU 11 of the controller 10 can control the motors 52 so that the distance between the thermal diffuser 73 and the hot plate 74 and the light source 5 reaches a prescribed value on the basis of a result of detection of the sensor 55.

The thermal processing apparatus according to the second embodiment thermally processes a semiconductor wafer W similarly to the first embodiment. The CPU 11 of the controller 10 controls the motors 52 to adjust the distance between the thermal diffuser 73 and the hot plate 74 holding the semiconductor wafer W and the light source 5 to obtain predetermined intensity of irradiation. The thermal processing apparatus according to the second embodiment changes the intensity of irradiation and receives a correction quantity also similarly to the first embodiment.

The thermal processing apparatus according to the second embodiment can also control the intensity of irradiation by adjusting the distance of irradiation while keeping a main discharge voltage applied to the flash lamps 69 constant similarly to the first embodiment, whereby the intensity of irradiation can be readily controlled without varying optical characteristics of light emitted from the flash lamps 69.

3. Third Embodiment

A thermal processing apparatus according to a third embodiment of the present invention is now described. The structure of the thermal processing apparatus according to the third embodiment is identical to that according to the first embodiment, and hence redundant description is omitted. When a semiconductor wafer W is arranged on a thermal processing position in the thermal processing apparatus according to the third embodiment, the distance between the surface of the semiconductor wafer W and each xenon flash lamp 69 is at least 40 mm and not more than 100 mm. The distance between the surface of the semiconductor wafer W and each xenon flash lamp 69 can be set to an arbitrary value in the range of at least 40 mm and not more than 100 mm by controlling the rotational frequency of a motor 40.

The thermal processing apparatus according to the third embodiment also thermally processes the semiconductor wafer W similarly to the first embodiment. In a flash heating step, however, the distance between the surface of the semiconductor wafer W and each xenon flash lamp 69 is at least 40 mm and not more than 100 mm, as hereinabove described. The distance between the surface of the semiconductor wafer W and each xenon flash lamp 69 is set in this range so that the thermal processing apparatus can homogeneously thermally process the semiconductor wafer W also when employing a plurality of xenon flash laps 69.

Figure 6:
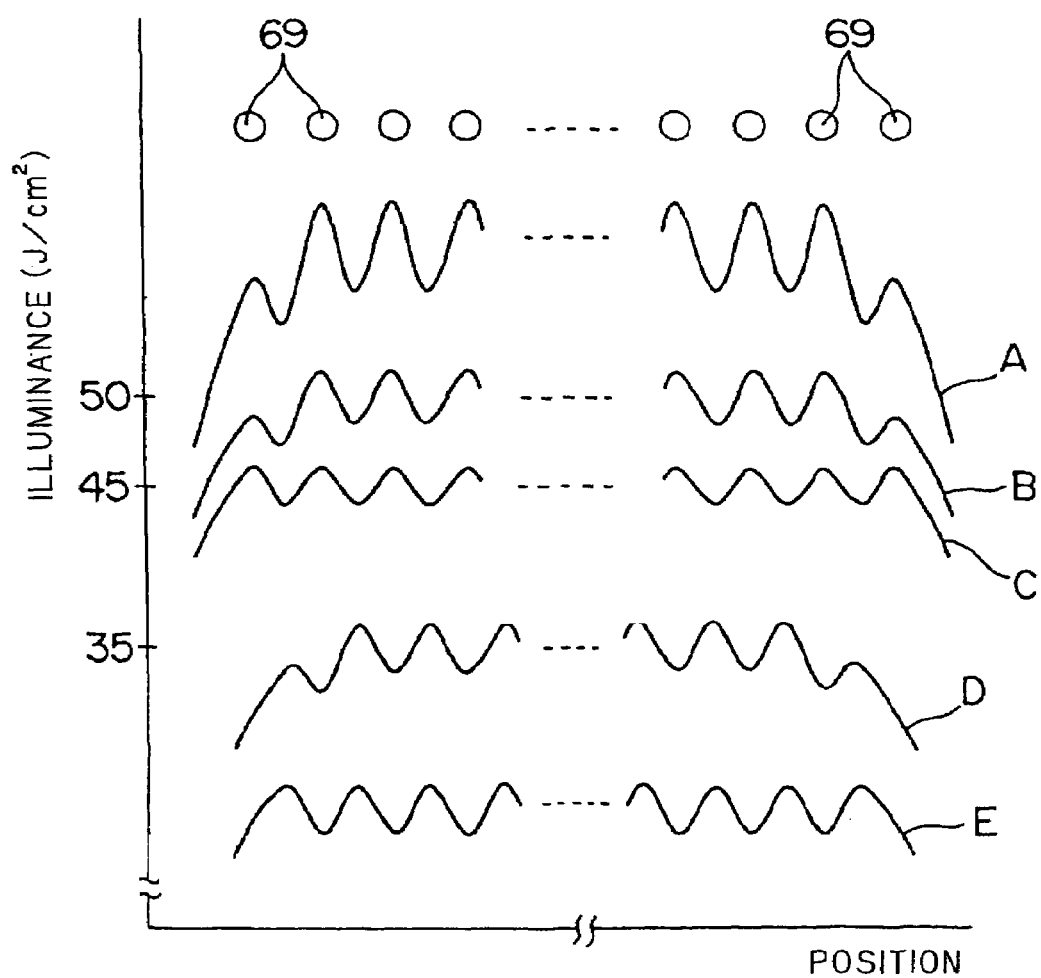
FIG. 6 is a graph schematically showing the relation between the illuminance of light emitted from xenon flash lamps toward the surface of a substrate and the positions of arrangement of the xenon flash lamps.

FIG. 6 is a graph schematically showing the relation between illuminance of light, emitted from the xenon flash lamps 69, on the surface of the semiconductor wafer W and the positions of arrangement of the xenon flash lamps 69.

In this graph, symbols A, B, C, D and E denote states where the distance between the surface of the semiconductor wafer W and each xenon flash lamp 69 is set to 20 mm, 40 mm, 50 mm, 100 mm and 150 mm respectively.

The illuminance is dispersed with respect to the average in the ranges of about 10%, about 5%, about 3%, about 5% and about 6% when the distance between the surface of the semiconductor wafer W and each xenon flash lamp 69 is set to 20 mm, 40 mm, 50 mm, 100 mm and 150 mm respectively.

In this thermal processing apparatus, dispersion of illuminance is preferably not more than 5% when processing the semiconductor wafer W. Therefore, the thermal processing apparatus according to the third embodiment sets the distance between the surface of the semiconductor wafer W and each xenon flash lamp 69 to at least 40 mm and not more than 100 mm for executing thermal processing, as hereinabove described.

If the distance between the surface of the semiconductor wafer W and each xenon flash lamp 69 is smaller than 40 mm, the semiconductor wafer W and a translucent plate 61 excessively approach to each other to disadvantageously block a flow of gas in a thermal processing chamber 65. If the distance between the surface of the semiconductor wafer W and each xenon flash lamp 69 exceeds 100 mm, on the other hand, temperature reduction disadvantageously results from heat dispersion around the semiconductor wafer W.

4. Fourth Embodiment

A thermal processing apparatus according to a fourth embodiment of the present invention is now described. The structure of the thermal processing apparatus according to the fourth embodiment is identical to that of the second embodiment (FIG. 5), and hence redundant description is omitted. Further, the thermal processing apparatus according to the fourth embodiment thermally processes a semiconductor wafer W also similarly to the second embodiment. However, the distance between the surface of the semiconductor wafer W and each xenon flash lamp 69 can be arbitrarily set in the range of at least 40 mm and not more than 100 mm by controlling the rotational frequency of motors 52.

The thermal processing apparatus according to the fourth embodiment can also homogeneously thermally process the semiconductor wafer W also when employing a plurality of xenon flash lamps 69, similarly to the thermal processing apparatus according to the third embodiment.

5. Modifications

While the embodiments of the present invention have been described, the present invention is not restricted to the aforementioned embodiments. For example, while the motor 40 vertically moves the thermal diffuser 73 and the hot plate 74 or the motors 52 vertically move the light source 5 in each of the aforementioned embodiments, the thermal diffuser 73 and the hot plate 74 as well as the light source 5 may alternatively be vertically moved at the same time. In other words, the thermal processing apparatus may relatively adjust the distance between holding means holding the semiconductor wafer W and the light source 5.

The encoder(s) forming the sensor(s) 25 or 55 may be replaced with an optical sensor directly measuring the distance between the thermal diffuser 73 and the light source 5.

A lamp such as a halogen lamp may alternatively be employed as assist-heating means in place of the hot plate 74.

While the thermal processing apparatus according to each of the aforementioned embodiments irradiates the semiconductor wafer W with light for activating ions, the substrate to be processed by the thermal processing apparatus according to the present invention is not restricted to the semiconductor wafer W. For example, the thermal processing apparatus according to the present invention may alternatively process a glass substrate formed with any silicon film such as a silicon nitride film or a polycrystalline silicon film. For example, silicon is ion-implanted into a polycrystalline silicon film formed on a glass substrate by CVD for forming an amorphous silicon film, and a silicon oxide film is formed thereon as an antireflective coating. In this state, the thermal processing apparatus according to the present invention can irradiate the overall amorphous silicon film with light for polycrystallizing the amorphous silicon film and forming a polycrystalline silicon film.

The thermal processing apparatus according to the present invention can also irradiate a TFT substrate prepared by forming an underlayer silicon oxide film and a polysilicon film obtained by crystallizing amorphous silicon and doping the polysilicon film with an impurity such as phosphorus or boron with light for activating the impurity implanted in the doping step.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for irradiating a substrate with a flash thereby heating said substrate, comprising:
    a flash heating element comprising a plurality of flash lamps arranged in a line, each flash lamp operable to irradiate said substrate with said flash;
    a holding element for holding said substrate, comprising an assist-heating element operable to preheat said substrate; and
    a reflector arranged to be opposed to said holding element in relation to said plurality of flash lamps, said reflector positioned and configured to reflect said flash emitted from said plurality of flash lamps toward said holding element, wherein
    a distance between a surface of said substrate and said flash heating element is set to at least 40 mm and not more than 100 mm, and
    said flash heating element is operable to irradiate said substrate preheated by said assist-heating element with said flash.

2. The thermal processing apparatus according to claim 1, further comprising an adjusting mechanism operable to adjust the distance between the surface of said substrate held by said holding element and said flash heating element.

3. The thermal processing apparatus according to claim 2, wherein said adjusting mechanism is operable to adjust the position of said holding element holding said substrate.

4. The thermal processing apparatus according to claim 2, wherein said adjusting mechanism is operable to adjust the positions of said plurality of flash lamps.

5. The thermal processing apparatus according to claim 1, wherein said assist-heating element is operable to preheat said substrate to a temperature of 200° C. to 600° C.

6. The thermal processing apparatus according to claim 5, wherein said plurality of flash lamps are operable to heat said substrate to a temperature of 1000° C. to 1100° C.

7. The thermal processing apparatus according to claim 1,
    wherein a distance between the surface of said substrate and said flash heating element is set to at least 40 mm and not more than 100 mm, and
    dispersion of luminance is not more than 5% when irradiating said substrate with said flash.

* * * * *